United States Patent
Ben Artsi et al.

(10) Patent No.: US 12,501,549 B2
(45) Date of Patent: Dec. 16, 2025

(54) PRINTED CIRCUIT BOARD VIA STRUCTURES WITH REDUCED INSERTION LOSS DISTORTION

(71) Applicant: Marvell Israel (M.I.S.L) Ltd., Yokne'am (IL)

(72) Inventors: Liav Ben Artsi, Nahariya (IL); Noam Kutscher, Shoham (IL)

(73) Assignee: MARVELL ISRAEL (M.I.S.L) LTD., Yokne'am (IL)

( * ) Notice: Subject to any disclaimer, the term of this patent is extended or adjusted under 35 U.S.C. 154(b) by 193 days.

(21) Appl. No.: 18/344,511

(22) Filed: Jun. 29, 2023

(65) Prior Publication Data

US 2024/0008180 A1    Jan. 4, 2024

Related U.S. Application Data

(60) Provisional application No. 63/357,036, filed on Jun. 30, 2022.

(51) Int. Cl.
| | |
|---|---|
| *H05K 1/11* | (2006.01) |
| *H05K 1/02* | (2006.01) |
| *H05K 3/42* | (2006.01) |

(52) U.S. Cl.
CPC .......... *H05K 1/115* (2013.01); *H05K 1/0233* (2013.01); *H05K 3/429* (2013.01); *H05K 2201/096* (2013.01)

(58) Field of Classification Search
CPC .... H05K 1/0245; H05K 1/0251; H05K 1/113; H05K 1/116; H05K 1/0216; H05K 1/0231; H05K 1/114; H05K 1/0228; H05K 2201/09636; H05K 2201/09418; H05K 2201/09454
See application file for complete search history.

(56) References Cited

U.S. PATENT DOCUMENTS

| | | | |
|---|---|---|---|
| 6,392,164 B1 * | 5/2002 | Iwaki | H05K 1/0251 174/265 |
| 7,897,880 B1 | 3/2011 | Goergen et al. | |
| 8,212,154 B2 | 7/2012 | Kashiwakura | |
| 2002/0130737 A1 | 9/2002 | Hreish et al. | |
| 2014/0238733 A1 * | 8/2014 | Mutnury | H05K 1/115 174/266 |
| 2018/0228019 A1 * | 8/2018 | Becker | H05K 1/116 |
| 2020/0375024 A1 | 11/2020 | Kim et al. | |

* cited by examiner

*Primary Examiner* — Roshn K Varghese (57) ABSTRACT

A printed circuit board (PCB) includes a plurality of stacked layers, each layer having a major plane defining a major plane of the PCB, a plurality of signal pads disposed on a signal pad layer of the PCB that is parallel to the major plane of the PCB, and a plurality of signal vias, each signal via in the plurality of signal vias having a longitudinal axis perpendicular to the major plane of the PCB, each signal via extending through the plurality of layers along the longitudinal axis, each respective signal via being electrically coupled to a respective signal pad of the plurality of signal pads, wherein at least one signal via in the plurality of signal vias includes an added capacitive structure which, along with inductance of that via, forms a corrective filter to reduce insertion loss deviation of at least one broadband signal in that via.

20 Claims, 5 Drawing Sheets

PRINTED CIRCUIT BOARD VIA STRUCTURES WITH REDUCED INSERTION LOSS DISTORTION

CROSS REFERENCE TO RELATED APPLICATION

This disclosure claims the benefit of commonly-assigned U.S. Provisional Patent Application No. 63/357,036, filed Jun. 30, 2022, which is hereby incorporated by reference herein in its entirety.

FIELD OF USE

This disclosure relates to a printed circuit board (PCB) having vias that are configured to reduce distortion. More particularly, this disclosure relates to a PCB having vias with built-in capacitive structures to form, together with other parts of the PCB, and "in-via" corrective filter to reduce distortions causing insertion loss deviation and signal loss within the via.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the subject matter of the present disclosure.

Printed circuit boards (PCBs) typically have multiple stacked layers, with each layer having electrical traces or routes. Signal vias may be provided to conduct signals from one layer of a PCB to another layer of the PCB. The more layers traversed by a via—i.e., the longer a via is—the greater the possibility for signal insertion deviation loss, which causes signal integrity issues. The insertion loss deviation may worsen when the length of the signal via is of a comparable length to the wavelength of the signals being transmitted through the signal via. For example, broadband signals may be transmitted through the signal via. If insertion loss deviates non-monotonically through that frequency range, a non-monotonic distortion will be introduced in the broadband signal. This may be of particular concern in the case of high-speed serial signals with a data rate of around 200 Gbps or more.

SUMMARY

In accordance with implementations of the subject matter of this disclosure, a printed circuit board includes a plurality of stacked layers, each layer having a respective major plane defining a major plane of the printed circuit board, a plurality of signal pads disposed on a signal pad layer of the printed circuit board that is parallel to the major plane of the printed circuit board, and a plurality of signal vias, each signal via in the plurality of signal vias having a longitudinal axis perpendicular to the major plane of the printed circuit board, each signal via extending through the plurality of stacked layers along the longitudinal axis, each respective signal via being electrically coupled to a respective signal pad of the plurality of signal pads, wherein at least one signal via in the plurality of signal vias includes an added capacitive structure which, along with inductance of the at least one signal via, forms a corrective filter to reduce insertion loss deviation of at least one broadband signal in the at least one signal via.

In a first implementation of such a printed circuit board, for each respective signal via in the at least one signal via, the added capacitive structure may include at least one additional pad, each additional pad extending from the respective signal via parallel to the major plane of the printed circuit board, without coupling conductively to any other portion of the printed circuit board.

According to a first aspect of that first implementation, each respective additional pad may be formed in a respective conductive layer of the plurality of stacked layers of the printed circuit board.

According to a second aspect of that first implementation, capacitance of each respective additional pad may be determined at least in part by at least one of (a) pad size of the respective additional pad, and (b) pad shape of the respective additional pad.

According to a third aspect of that first implementation, each respective additional pad may be disposed at a respective position along the signal via, causing signal reflections resulting in constructive signal interference that increases signal magnitude of selected portions of the at least one broadband signal to reduce the insertion loss deviation of the at least one broadband signal.

In a first instance of that third aspect, magnitude of the constructive signal interference of the at least one broadband signal may be adjustable by modifying a respective position of a respective additional pad based on a range of wavelengths of the at least one broadband signal.

According to a fourth aspect of the first implementation, each respective additional pad of at least one signal via may be separated from at least one stacked layer of the printed circuit board by a via anti-pad.

In a second implementation of such a printed circuit board, the plurality of signal pads may include a plurality of differential signal pad pairs, wherein each differential signal pad pair in the plurality of differential signal pad pairs includes a positive signal pad, and a negative signal pad.

According to a first aspect of that second implementation, the plurality of signal vias may include a plurality of signal via pairs, each signal via pair including a positive signal via and a negative signal via, wherein each via from among the positive signal via and the negative signal via may include a corresponding additional pad, each of the additional pad of each via from among the positive signal via and the negative signal via being separated from at least one stacked layer of the printed circuit board by a plurality of via anti-pads.

In a first instance of that first aspect, the positive signal pad of at least one of the plurality of differential signal pad pairs may be electrically coupled to the positive signal via of at least one of the plurality of signal via pairs, and the negative signal pad of at least one of the plurality of differential signal pad pairs may be electrically coupled to the negative signal via of at least one of the plurality of signal via pairs.

In a third implementation of such a printed circuit board, the signal pad layer may be a surface layer of the printed circuit board.

In a fourth implementation of such a printed circuit board, a respective one of the plurality of signal pads may be disposed on a respective internal layer, parallel to the major plane, of the printed circuit board.

In accordance with implementations of the subject matter of this disclosure, a method for fabricating a printed circuit board includes stacking a plurality of printed circuit board layers, each printed circuit board layer having a respective major plane parallel to a major plane of the printed circuit board, forming a plurality of signal pads disposed on a signal pad layer of the printed circuit board that is parallel to the major plane of the printed circuit board, electrically coupling a plurality of signal vias to each of the plurality of signal pads, each respective signal via in the plurality of signal vias having a longitudinal axis perpendicular to the major plane of the printed circuit board, each signal via extending through the plurality of printed circuit board layers along the longitudinal axis, each respective signal via being electrically coupled to a respective signal pad of the plurality of signal pads, and providing an added capacitive structure in at least one signal via in the plurality of signal vias, which, along with inductance of the at least one signal via, forms a corrective filter to reduce insertion loss deviation of at least one broadband signal in the at least one signal via.

In a first implementation of such a method, forming the added capacitive structure may include forming at least one additional pad, each additional pad extending from the respective signal via parallel to the major plane of the printed circuit board, without coupling conductively to any other portion of the printed circuit board.

A first aspect of that first implementation may further include forming each respective additional pad in a respective conductive layer of the plurality of printed circuit board layers of the printed circuit board.

A second aspect of that first implementation may further include determining capacitance of each respective additional pad based on at least one of (a) pad size of the respective additional pad, (b) pad shape of the respective additional pad, and (c) a pad location of the respective additional pad.

A second aspect of that first implementation may further include positioning each respective additional pad at a respective position along the signal via, causing signal reflections resulting in constructive signal interference that increases signal magnitude of selected portions of the at least one broadband signal to reduce the insertion loss deviation of the at least one broadband signal.

A first instance of that second aspect may further include adjusting the constructive signal interference of the at least one broadband signal by modifying a respective position of a respective additional pad based on a range of wavelengths of the at least one broadband signal.

In a first variation of that first instance, modifying a respective position of the respective additional pad to adjust the constructive signal interference caused by the signal reflections may include determining whether an insertion loss deviation target has been achieved by including the respective additional pad in a respective printed circuit board layer and, when the insertion loss deviation target has not been achieved, moving the respective additional pad into a respective adjacent printed circuit board layer of the signal via, and repeating the determining and the moving until the insertion loss deviation target has been achieved.

In a second implementation of such a method, forming a plurality of signal pads may include forming a plurality of differential signal pad pairs, wherein each differential signal pad pair in the plurality of differential signal pad pairs includes a positive signal pad, and a negative signal pad.

According to a first aspect of that second implementation, electrically coupling a plurality of signal vias may include electrically coupling a plurality of signal via pairs, each signal via pair including a positive signal via and a negative signal via, wherein each via from among the positive signal via and the negative signal via includes a corresponding capacitive structure to form a corresponding corrective filter, the corresponding capacitive structure including at least one additional pad, each of the additional pads of the capacitive structure for each via from among the positive signal via and the negative signal via being separated from at least one printed circuit board layer of the printed circuit board by a plurality of via anti-pads.

A first instance of that first aspect may further include electrically coupling the positive signal pad of at least one of the plurality of differential signal pad pairs to the positive signal via of at least one of the plurality of signal via pairs, and electrically coupling the negative signal pad of at least one of the plurality of differential signal pad pairs to the negative signal via of at least one of the plurality of signal via pairs.

In a third implementation of such a method, forming a plurality of signals pads disposed on a signal pad layer of the printed circuit board may include forming a plurality of signal pads disposed on a surface layer of the printed circuit board that is parallel to the major plane of the printed circuit board.

In a fourth implementation of such a method, forming a plurality of signals pads disposed on a signal pad layer of the printed circuit board may include forming at least one signal pad out of the plurality of signal pads on an internal layer, parallel to the major plane, of the printed circuit board.

In accordance with implementations of the subject matter of this disclosure, a method for reducing insertion loss deviation of at least one broadband signal in a printed circuit board comprising a plurality of layers, each layer having a respective major plane parallel to a major plane of the printed circuit board, a plurality of signal pads, each signal pad being on a signal pad layer of the printed circuit board that is parallel to the major plane, and a plurality of signal vias electrically coupled to each of the plurality of signal pads, wherein each respective signal via has a longitudinal axis perpendicular to the major plane, wherein each signal via extends through the plurality of layers along the longitudinal axis, includes forming at least one signal via in the plurality of signal vias with a capacitive structure comprising at least one additional pad that is not electronically coupled to other metallic elements of the printed circuit board, each additional pad extending from the respective signal via parallel to the major plane, and positioning the at least one additional pad along the longitudinal axis of the respective signal via based on a range of wavelengths of at least one broadband signal of which the insertion loss deviation is to be reduced.

In a first implementation of such a method, positioning the at least one additional pad along the longitudinal axis of the respective signal via based on a range of wavelengths may include positioning each respective additional pad at a respective position along the signal via, causing signal reflections resulting in constructive signal interference that increases signal magnitude of selected portions of the at least one broadband signal to reduce the insertion loss deviation of the at least one broadband signal.

A first aspect of that first implementation may further include adjusting the constructive signal interference of the at least one broadband signal by modifying a respective position of a respective additional pad based on a range of wavelengths of the at least one broadband signal.

In a first instance of that first aspect, adjusting the constructive signal interference of the at least one broadband signal by modifying a respective position of a respective additional pad may include determining whether an insertion loss deviation target has been achieved by including a respective additional pad in a respective printed circuit board layer and, when the insertion loss deviation target has not been achieved, moving the respective additional pad into a respective adjacent printed circuit board layer of the signal via, and repeating the determining and the moving until the insertion loss deviation target has been achieved.

BRIEF DESCRIPTION OF THE DRAWINGS

Further features of the disclosure, its nature, and various advantages, will be apparent upon consideration of the following detailed description, taken in conjunction with the accompanying drawings, in which like reference characters refer to like parts throughout, and in which.

DETAILED DESCRIPTION

The possibility of insertion loss deviation of signals in signal vias of a PCB increases as the length of the signal via approaches the order of magnitude of a wavelength of the signals transmitted through the signal via. This phenomenon may arise for a signal of a given wavelength as via length increases, or for a constant via length as wavelength decreases (i.e., as frequency increases), giving rise, in either case, to poor signal integrity for signals passing through the signal via.

Additionally, for signals having a wavelength comparable to—i.e., on the same order of magnitude as—the length of the signal via (e.g., for a signal via with a length greater than 1 mm, transmitting broadband signals having data rate at or above 200 Gbps), there is a greater likelihood of insertion loss deviation than for lower-data-rate signals.

Printed circuit boards and methods of forming printed circuit boards may be implemented according to the subject matter of this disclosure for use with broadband signals. In some implementations, a range of wavelengths of signals are transmitted through a signal via at which insertion loss deviation of the signals occurs.

Insertion loss, which may be defined as the energy loss of signals, as a function of frequency, during transmission through a transmission material in a direction of a signal path, may be caused by any of the following: (a) reflected insertion loss, (b) dielectric insertion loss, (c) conductive material insertion loss, (d) radiated insertion loss, and (e) surface roughness insertion loss. Insertion loss may be measured for a range of frequencies of signals transmitted through a transmission material. Insertion loss deviation may be defined as a difference between an expected insertion loss and the observed insertion loss, for a respective signal frequency. At high serial signal frequencies (e.g., 100 Gbps or greater), insertion loss deviation may create distortion (e.g., signal phase distortion) that causes unexpected results or errors in the recovery of signals after passing through a signal via.

In accordance with implementations of the subject matter of this disclosure, a corrective filter may be formed in a signal via of a PCB adding at least one additional pad along the length of the signal via. Each additional pad may be formed in one of the metal layers of the PCB, but not connected electrically to the remainder of that metal layer or to any other circuit element on the PCB. Each additional pad forms a capacitive relationship with another metallic structure or structures in the PCB, and the resulting capacitance interacts with the inductance inherent in the signal via (e.g., a barrel inductance) to create, along with the delay related to the distance between capacitive structures embedded into the via, the corrective filter. The capacitance of a pad may be altered by modifying the size and/or the shape and/or position of that pad to adjust the filter characteristics, tuning the filter to a particular band of frequencies within the signal, assuming that broadband signals of various wavelengths— and therefore various frequencies—are transmitted through the signal via. The characteristics of the via, including the via length, the location of pads along the length of the via, the presence of stubs, and anti-pad diameter, as well as additional mechanical aspects of the via, determine the insertion loss deviation as a function of frequency, as well as cut-offs in the frequency domain performance of the via.

In some implementations, each additional pad may cause signal reflections. In particular, if there two or more additional pads, there may be repeated reflections, between two adjacent additional pads, of the signal, within the particular band of frequencies. The signal transmission delays resulting from those reflections may cause constructive interference in the signal, boosting the signal magnitude and reducing the insertion loss deviation of the signal in the particular band of frequencies.

In addition, the signal via may include a signal via stub between the end of the signal via within the PCB and the closest signal via pad to that end. The signal via stub may be a residual portion of the signal via formed by the counter-boring of the signal via. The signal via stub may limit the signal via bandwidth and also may increase the insertion loss deviation of the signals transmitted through the signal via. The corrective filter created by adding at least one capacitive structure may reduce the amount of insertion loss deviation caused by the signal via stub.

A PCB has a major plane defined by the largest surface of the PCB, and each respective signal via has a longitudinal axis perpendicular to the major plane. As noted above, the integrated corrective filter may be formed in a signal via by creating a capacitive structure, such as by adding additional pads at various metal layers of the PCB through which the signal via passes, where no signal pad would otherwise be needed. Each added additional pad is not electrically coupled to the metal layer in which it is formed or to any electrical components of the PCB. Each such pad may form a capacitive relationship with any one other metallic structure in the PCB, including, but not limited to, (a) a corresponding capacitive pad of a capacitive structure of an adjacent signal via, (b) signal traces or conductive layers of adjacent PCB layers, (c) board ground layers, and (d) adjacent signal vias. In some implementations, the capacitive relationship may include capacitance from a fringing effect that is formed by (a) a respective additional pad within a respective PCB layer and (b) a conductive element (e.g., a trace, signal via, additional pad) on a respective adjacent dielectric PCB layer. The capacitance may be adjusted by varying the pad size and/or the pad shape and/or the pad position.

In accordance with some implementations of the subject matter of this disclosure, the respective position of an additional pad of a respective capacitive structure added to form a corrective filter along a corresponding signal via is determined based on the length of the corresponding signal via, the resulting signal transmission delay of signals transmitted through the signal via with the respective position of the additional pad, and the range of wavelengths of the signals transmitted on the corresponding signal via.

In some implementations, the position of each additional pad may be iteratively adjusted (e.g., by iterative simulations, calculations, and/or measurements) in order to determine a position of the additional pad that causes the greatest reduction of insertion loss deviation of signals passing through the signal via.

The number of additional pads of the capacitive structure disposed along the respective signal via to form a corrective filter may be determined based on the signal transmission delay corresponding to the length of the respective signal via and the wavelengths of the signals (e.g., broadband signals) transmitted through the signal via. For example, the number of additional pads of the capacitive structure added to form a corrective filter may be determined based on a ratio of the length of the respective signal via to a wavelength from among the range of wavelengths of the broadband signals transmitted through the signal via. The number of additional pads so determined may then be disposed, at least initially, at uniform distances along the respective signal via in order to cause signal transmission delays between any two adjacent additional pads disposed along the respective signal via. As noted above, the signal transmission delays may cause constructive signal interference resulting from signal reflections between any two adjacent additional pads along a respective signal via. The constructive interference may reduce the insertion loss deviation of the signals transmitted along the respective signal via, and the constructive signal interference may be adjusted or tuned by changing on or more of a position, size, and shape of a respective additional pad disposed along the respective signal via.

As noted above, the capacitance formed by a respective additional pad of a capacitive structure added to form a corrective filter may be adjusted by changing the size, shape or location of a respective additional pad. However, in some implementations, the size of the respective additional pad may not be enlarged because of layout footprint constraints, such as the presence of other components in the layer of the PCB surrounding the respective additional pad, or due to manufacturing limitations on the positioning of two components close together on the same PCB layer. In such implementations, the pad shape may be altered in order to alter the capacitance of the additional pad without exceeding layout footprint constraints of the additional pad or manufacturing limitations of the PCB layer.

For example, a corrective filter may be formed in a signal via, by adding a capacitive structure including at least one additional pad of a circular pad shape, having a respective pad size including a respective pad diameter, and having a layout footprint constraint. The layout footprint constraint of each additional pad may be imposed by one or more other components disposed in the respective conductive layer of the PCB in which the respective additional pad is disposed. If the capacitance of the respective capacitive element needs to increase, but the pad size of the respective additional pad may not be enlarged uniformly in all radial directions from the longitudinal axis of the signal via due to the presence of another component or any other manufacturing limitation, the pad shape may be modified by extending or enlarging the respective additional pad in a direction away from the other component within the respective conductive layer of the respective additional pad. This enables the pad size of the respective additional pad to increase while remaining within the layout footprint constraints and manufacturing limitations of the PCB layers.

The capacitive interactions between the capacitive elements formed by the additional pads, and the barrel inductance of the corresponding signal via, may act as a corrective filter, to reduce the insertion loss deviation for signals of a range of frequencies. The corrective filter may be tuned, e.g. in a PCB design, by varying the respective locations, sizes and shapes of the capacitive elements.

In some implementations, the signal vias are arranged in differential signal via pairs, each pair including a positive signal via and a negative signal via. Normally, in such a case, the positive signal via and the negative signal via are parallel to each other. Insertion loss deviation may be observed in the differential signal insertion loss behavior of the structure including both the positive signal via and the negative signal via, and any additional reference vias in the vicinity of the signal vias. The delay related to the length of both signal vias being a major factor of the insertion loss behavior. In some differential implementations, for each differential signal via pair, respective capacitive structures may be added to each of the positive signal via and the negative signal, to form respective corrective filters.

According to further implementations of the subject matter of this disclosure, ground vias may be arranged in the PCB and coupled to one or more PCB ground layers to match the impedance of the integrated corrective filter formed by adding the capacitive structures to the signal vias, and to minimize the noise on the signal vias due to interference (e.g., crosstalk interference) from other signal vias or any adjacent components disposed within layers of the PCB (e.g., signal traces, or pads in adjacent signal vias).

In some implementations, there may be anti-pads, or non-conductive pockets within the stacked PCB layers in order to electrically isolate each respective signal via and its corresponding capacitive structure, added to form a corrective filter, from each of the stacked layers of the PCB through which the signal via passes.

In implementations where the length of each signal via is within one order of magnitude of the signal wavelength (e.g., a via length of about 1 mm for signals having a data rate of 200 Gbps), the signal vias may not need any added capacitive structure to form a corrective filter. Instead, the impedance (e.g., differential impedance, common mode impedance, or single-ended impedance) of each signal via may be optimized by arranging the signals vias closer to or farther away from ground vias, changing the pitch between each respective signal via and each other respective adjacent signal via. As the pitch between two signal vias increases, the respective impedance increases. In some implementations, the size of anti-pads in all layers of the PCB may be adjusted based on any change in the pitch between two signal vias.

In implementations where the length of each signal via is greater than the order of magnitude of the signal wavelength (e.g., a via length greater than 1 mm when the signal data rate is 200 Gbps), the number of additional pads disposed along the longitudinal axis of the signal via to form the corrective filter may be determined based on the length of the signal via. The positions of the additional pads may initially be distributed uniformly along the signal via. The final position for each additional pad may be determined in an iterative fashion to determine an optimized position in order to achieve an insertion loss deviation target. On each iteration, if the insertion loss deviation target has not been achieved, then the position of one of the additional pads is changed by one layer of the PCB to determine whether the change approaches or achieves the insertion loss deviation target for the corrective filter formed by addition of the capacitive structure.

The subject matter of this disclosure may be better understood by reference to FIGS. 1-5.

Figure 1:
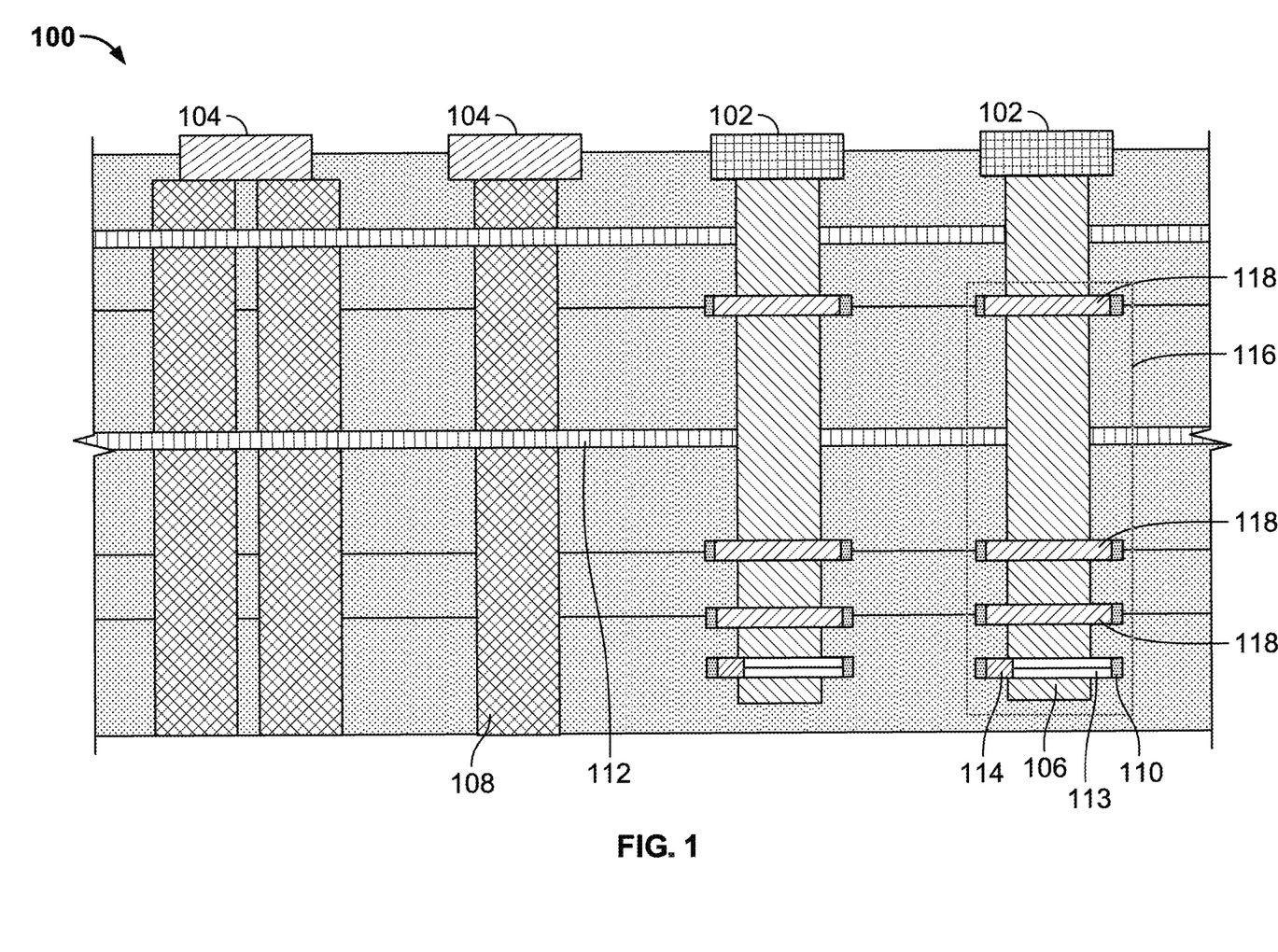
FIG. 1 is a cross-sectional view of a printed circuit board incorporating implementations of the subject matter of this disclosure.

FIG. 1 is a cross-sectional view of a printed circuit board 100, in accordance with implementations of the subject matter of this disclosure. Printed circuit board (PCB) 100 includes signal pads 102 and ground pads 104. Signal pads 102 and ground pads 104 are configured to electrically couple to pins of an integrated circuit device or pins of additional circuit boards. According to implementations of the subject matter of this disclosure, printed circuit board 100 further includes signal vias 106, ground vias 108, anti-pads 110, one or more board ground layers 112, one or more board power layers (not shown), a signal via pad 113 and signal traces 114, all of which are positioned in various layers of the PCB 100.

In some implementations, the signal pads 102 are grouped into differential signal pad pairs, each of which includes a positive signal pad and a negative signal pad. In such implementations, the signal vias 106 are arranged in parallel differential via pairs, each pair including a positive signal via that is electrically coupled to a positive signal pad and a negative signal via that is electrically coupled to a negative signal pad. Within the printed circuit board layers through which the signal vias 106 pass, insertion loss deviation may occur in the positive and negative signal vias depending on the length of each of the positive signal via and the negative signal via and the wavelength of the signals transmitted along the signal vias 106.

Each of the signal vias 106 may be electrically coupled to a respective signal trace 114 by way of a signal via pad 113. The signal traces 114 carries a signal that is transmitted from the signal pad 102 to a corresponding pin of a device. Additionally, the printed circuit board 100 may also include one or more board ground layers 112. In some implementations, the ground vias 108 may be electrically coupled to a ground of the circuit board (e.g., one or more ground layers 112). In some implementations, the PCB 100 may include power supply vias (not shown), which are electrically coupled to the one or more board power layers (not shown).

In addition, in some implementations, anti-pads 110, which are non-conductive pockets in a layer or layers of the printed circuit board 100, may be provided surrounding one or more of the signal vias 106 and respective additional pads 118 of the corresponding capacitive structure 116 added to form a corrective filter. The anti-pads 110 isolate the additional pads 118 from the respective layer of the PCB from which each respective additional pad is formed. In some implementations, the signal pads 102 may be electrically coupled to the signal vias 106 and the ground pads 104 may be electrically coupled to the ground vias 108. In some implementations, each signal via 106 defines a respective longitudinal axis perpendicular to the major plane of the PCB 100, and each signal via 106 extends through the layers of the PCB 100 along the respective longitudinal axis.

Each respective signal via 106 may have a capacitive structure 116 include at least one additional pad 118 to form a corrective filter in order to reduce the insertion loss deviation of signals transmitted through the respective signal via 106. Capacitive structures 116, added to for a corrective filter, are implemented by forming additional pads 118 that are positioned along the longitudinal axis of the signal via 106, which may extend perpendicular to a major plane formed by a largest surface layer of the PCB 100. Each of the additional pads 118 may be formed from one of the metal layers of PCB 100. In some implementations, the additional pads are not electrically connected to any other component or conductive element within the structure of PCB 100. In some implementations, the additional pads 118 also may be used to enhance structural integrity of PCB 100, while in other implementations additional structural integrity that can be provided by additional pads 118 is not needed.

Each of additional pads 118 may form a capacitive relationship with any other metallic structure in PCB 100, including any respective one of additional pads 118 of the same capacitive structure 116, or any conductive layers, structures or traces in the PCB (e.g., signal traces 114, signal via pads 113, signal vias 106, and corresponding additional pads of adjacent signal vias).

The capacitive interactions of each capacitive element formed by the additional pads 118 positioned along signal via 106, along with the barrel inductance of the signal via 106, together form a corrective filter to reduce insertion loss deviation of transmitted signals of a particular frequency or signals of a range of frequencies transmitted through the signal via 106. In some implementations, the capacitance of the respective capacitive element formed by each additional pad 118 in the capacitive structure 116, added to form a corrective filter, may be tuned by modifying the size or shape of the additional pad 118, as well as the spacing of that additional pad 118 relative to other metallic elements.

It may be necessary in some implementations to increase the pad size of a respective additional pad 118 to increase the capacitance of the corresponding formed capacitive element. As discussed above, in some implementations, the pad size of the respective additional pad 118 having a particular pad shape (e.g., a circular pad) may not be enlarged because of layout footprint constraints or manufacturing mechanical limitations. In such implementations, the pad shape may be altered—for example by changing the shape of the pad to a square, rectangle, other multi-sided polygon, ellipse, teardrop or any other suitable geometric shape—in order to adjust and further increase the area of the additional pad 118 without exceeding layout footprint constraints of the additional pad 118.

The positions of the additional pads 118 disposed along a corresponding signal via 106 may be determined based on a range of wavelengths of at least one signal transmitted through the corresponding signal via 106. In some implementations, the positions of the additional pads 118 may be selected to cause signal reflections between any two adjacent additional pads 118 disposed along the signal via 106, resulting in transmission delays that cause constructive signal interference. When optimized, the constructive signal interference may cause an increased signal magnitude to aid in the reduction of insertion loss deviation of signals transmitted along the signal via 106.

Although as depicted in FIG. 1, signal pads 102, from which signal vias 106 extend, are disposed on the surface layer of PCB 100, in some implementations, one or more of signal vias 106 may be a "buried via" extending completely internally of PCB 100. In a case of any completely internal signal via 106, a corresponding signal pad 102 may be disposed on an internal layer of PCB 100, and if there is more than one buried signal via 106, the corresponding signal pads 102 may not be disposed on the same internal layer of PCB 100. That is, in some implementations, the signal pads 102 may be disposed on different internal layers from among the plurality of layers.

Figure 2:
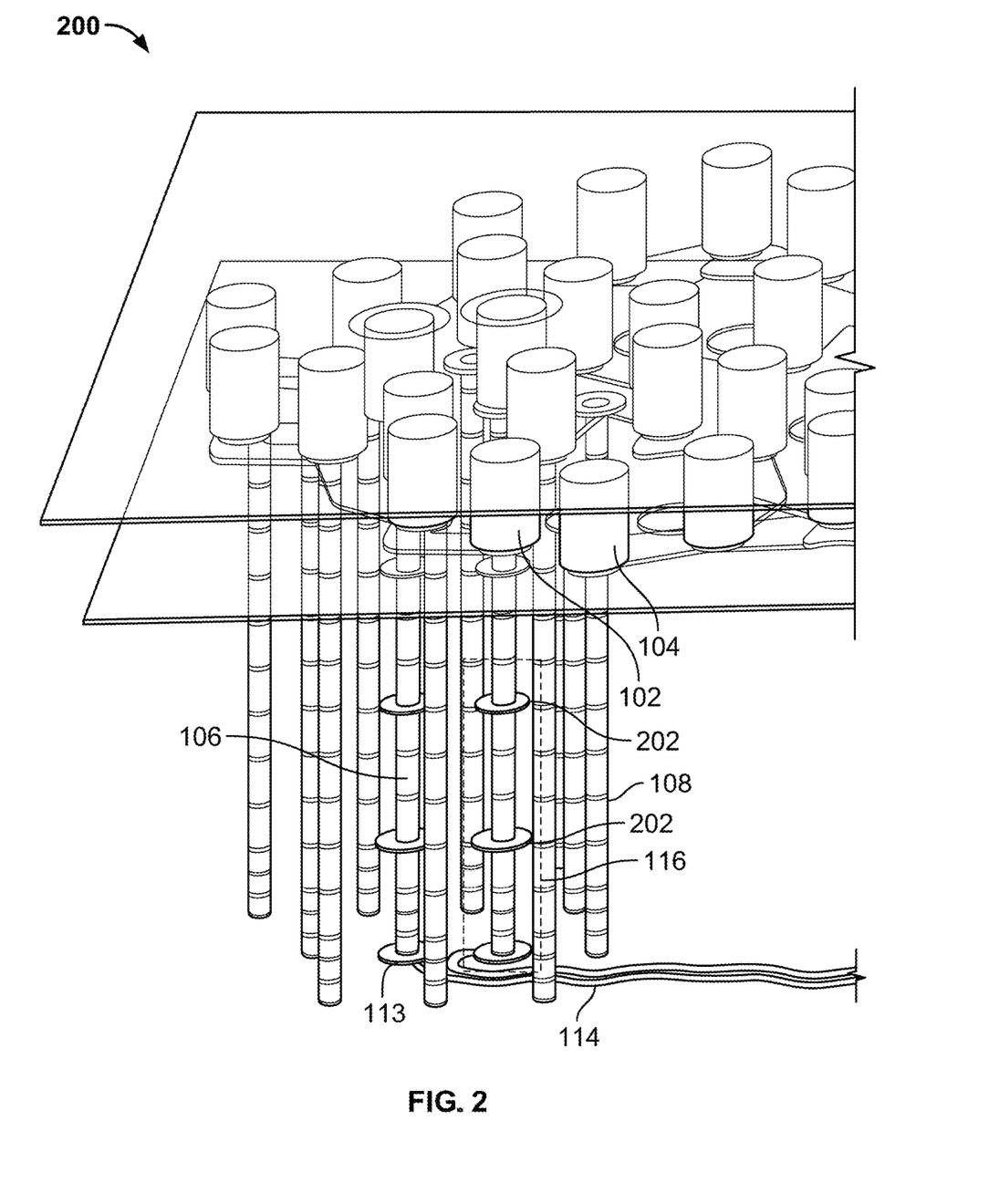
FIG. 2 is a perspective view of signal vias in a printed circuit board, with portions of the printed circuit board removed for clarity, where the vias include capacitive structures to form a corrective filter in accordance with implementations of the subject matter of this disclosure.

FIG. 2 is a perspective view of signal vias (e.g., signal via 106) in a printed circuit board, where the signal vias include capacitive structures (e.g., capacitive structures 116) in accordance with implementations of the subject matter of this disclosure for forming respective corrective filters in each signal via 106. Each of the capacitive structures 116, added to form a corrective filter, includes at least one additional pad 202, each additional pad 202 having a pad size, a pad shape, and a pad location along signal via 106. Each additional pad 202 disposed along a respective signal via 106 may forms a capacitive relationship with any other metallic structure in the PCB 100, including, but not limited to, (a) a corresponding capacitive pad in the same or an adjacent signal via, (b) signal traces 114 or conductive layers of adjacent PCB layers, (c) board ground layers, and (d) adjacent signal vias. The capacitance of each respective capacitive element formed in part by each respective additional pad 202 may be altered by modifying at least one of (a) the pad size of the respective additional pad 202, (b) the pad shape of the respective additional pad 202, and (c) the location of the respective additional pad 202.

As shown in FIG. 2, additional pads 202 may be extended to include additional geometrical features in order to increase the area of the additional pad 202, by modifying the pad shape of the additional pad 202, thereby increasing the capacitance. The added area of the respective additional pad 202 increases the capacitance of the respective capacitive element formed between the respective additional pad 202 and any conductive layers, structures or traces in the PCB (e.g., signal traces 114, signal via pads 113, signal vias 106, corresponding additional pads of adjacent capacitive structures 116 and dielectric layers of the PCB) in proximity to the respective capacitive element. Modifying the pad shape of a respective additional pad 202 may be useful to avoid other components that surround the respective additional pad 202 in the stacked layer in which the additional pad 202 is disposed.

Figure 3:
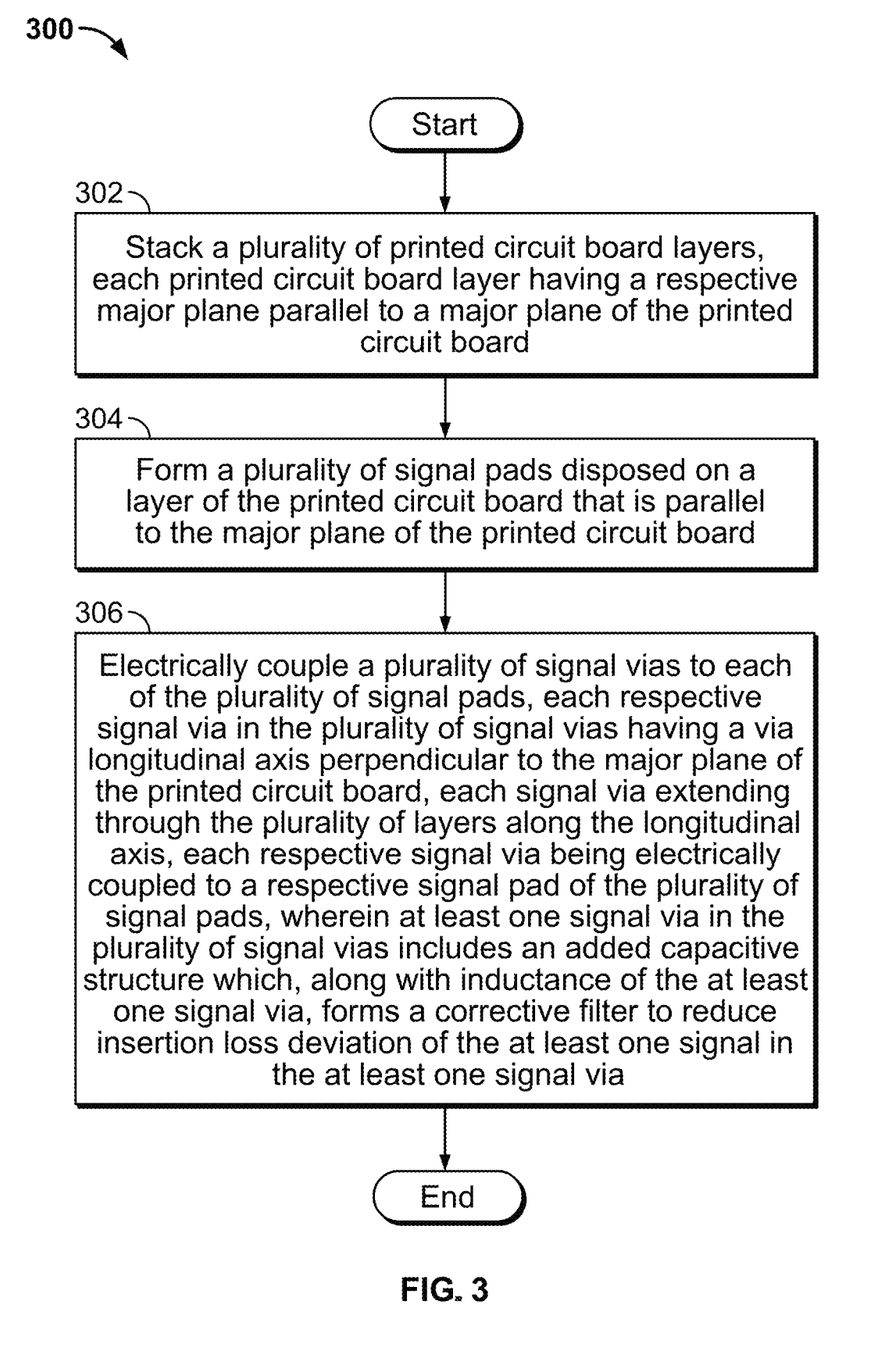
FIG. 3 is a flowchart of a method, according to some implementations of the subject matter of this disclosure, for forming a printed circuit board.

A method 300 in accordance with implementations of the subject matter of this disclosure for fabricating a printed circuit board is diagrammed in FIG. 3. Method 300 begins at 302, where a plurality of printed circuit board layers is stacked, each printed circuit board layer having a respective major plane parallel to the major plane of the printed circuit board. In some implementations, conductive electronic elements are formed on the layers which are subsequently stacked in suitable alignment, while in other implementations the conductive electronic elements are formed, in suitable alignment, on the various layers during stacking build-up of the printed circuit board. At 304, a plurality of signal pads are formed, disposed on a layer of the printed circuit board that is parallel to the major plane of the printed circuit board. At 306, a plurality of signal vias is electrically coupled to each of the plurality of signal pads, each respective signal via in the plurality of signal vias having a longitudinal axis perpendicular to the major plane of the printed circuit board, each signal via extending through the plurality of layers along the longitudinal axis, each respective signal via being electrically coupled to a respective signal pad of the plurality of signal pads, wherein at least one signal via in the plurality of signal vias includes an added capacitive structure which, along with inductance of the at least one signal via, forms a corrective filter to reduce insertion loss deviation of the at least one signal in at least one signal via.

Figure 4:
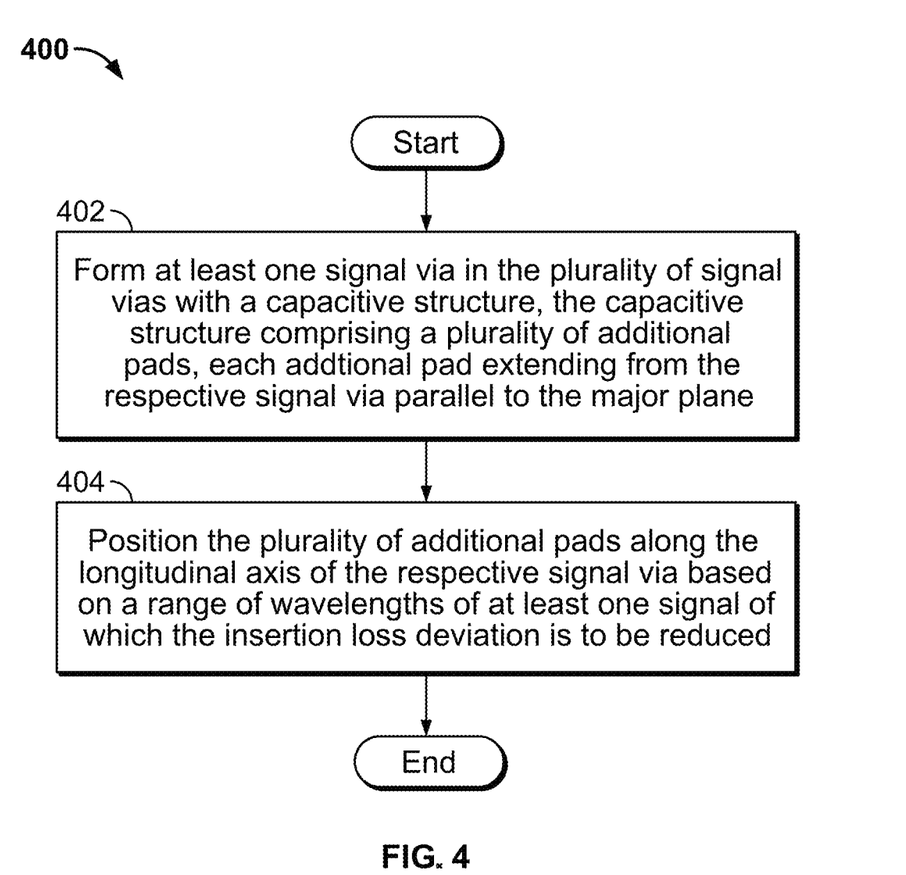
FIG. 4 is a flowchart of a method, according to some implementations of the subject matter of this disclosure, for forming a via with capacitive structures to form a corrective filter.

A method 400 in accordance with implementations of the subject matter of this disclosure for fabricating a printed circuit board is diagrammed in FIG. 4. Method 400 begins at 402, where a capacitive structure is formed in at least one signal via in the plurality of signal vias, to form a corrective filter, the capacitive structure including a plurality of additional pads, each additional pad extending from the respective signal via parallel to the major plane. At 404, the plurality of additional pads are positioned along the longitudinal axis of the respective signal via based on a range of wavelengths of at least one signal of which the insertion loss deviation is to be reduced.

Figure 5:
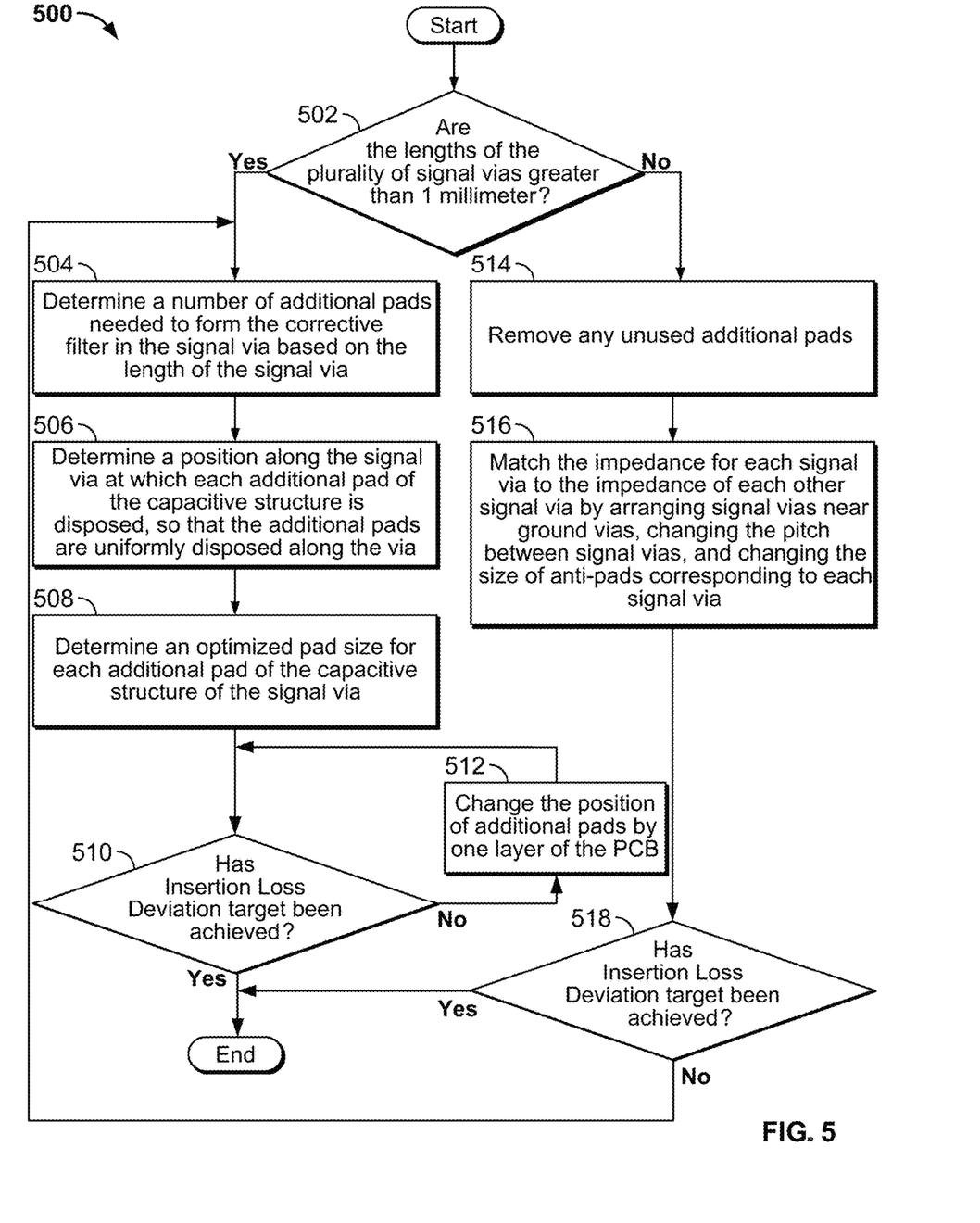
FIG. 5 is a flowchart of a method, according to some implementations of the subject matter of this disclosure, for tuning a corrective filter formed by capacitive structures in a via in a printed circuit board.

One implementation of a method 500 in accordance with implementations of the subject matter of this disclosure for tuning a filter for broadband signals in a printed circuit board, by positioning the additional pads based on a wavelength of a signal, is diagrammed in FIG. 5. Method 500, which is repeated for each signal via (or for each differential signal via pair in an implementation for differential signals), begins at 502, where it is determined whether the length of current via of the plurality of signal vias is greater than 1 millimeter. If so, then at 504, a number of additional pads needed to form the corrective filter in the signal via based on the length of the signal via is determined. At 506, a position along the signal via at which each additional pad of the capacitive structure is to be disposed is determined; initially the additional pads are uniformly spaced along the signal via.

At 508, an optimized pad size for each additional pad of the capacitive structure which forms part of the corrective filter in the signal via is determined. At 510, it is determined whether an insertion loss deviation target has been achieved. If so, method 500 ends. If at 510 the insertion loss deviation target has not been achieved, then the flow continues at 512, where the position of one of the additional pads is changed by one layer of the PCB. The change in position of additional pads by one layer at 512 is iterative, in that the flow returns to 510 to determine whether the insertion loss deviation target has been achieved.

If at 502 it is determined that the length of current via of the plurality of signal vias is not greater than 1 millimeter, than at 514, unused additional pads are removed, and at 516, the impedance for each signal via is matched to the impedance of each other signal via by arranging signal vias near ground vias, changing the pitch between signal vias, and changing the size of anti-pads corresponding to each signal via. At 518, it is determined whether an insertion loss deviation target has been achieved for the signal via of a length less than or equal to 1 mm. If at 518, the insertion loss deviation target has been achieved, the method 500 ends. If it is determined, at 518, that the insertion loss deviation target has not been achieved, flow proceeds to 504.

Thus it is seen that a PCB having vias with built-in corrective filter to reduce the distortions caused by insertion loss deviation has been provided.

As used herein and in the claims, which follow, the construction "one of A and B" shall mean "A or B."

It is noted that the foregoing is only illustrative of the principles of the invention, and that the invention can be practiced by other than the described embodiments, which are presented for purposes of illustration and not of limitation, and the present invention is limited only by the claims which follow.

What is claimed is:

1. A printed circuit board comprising:
    a plurality of stacked layers, each layer having a respective major plane defining a major plane of the printed circuit board;
    a plurality of signal pads disposed on a signal pad layer of the printed circuit board that is parallel to the major plane of the printed circuit board; and
    a plurality of signal vias, each signal via in the plurality of signal vias having a longitudinal axis perpendicular to the major plane of the printed circuit board, each signal via extending through the plurality of stacked layers along the longitudinal axis, each respective signal via being electrically coupled to a respective signal pad of the plurality of signal pads;
    wherein at least one signal via in the plurality of signal vias includes an added capacitive structure which, along with inductance of the at least one signal via, forms a corrective filter to reduce insertion loss deviation of at least one broadband signal in the at least one signal via;
    wherein the added capacitive structure comprises a plurality of additional pads, each additional pad extending from the respective signal via parallel to the major plane of the printed circuit board without coupling conductively to any other portion of the printed circuit board;
    wherein a capacitance of a respective capacitive element formed by each additional pad is tuned by modifying size, shape, and spacing of that additional pad relative other metallic elements of the printed circuit board; and
    wherein positions of the additional pads disposed along the respective signal via are selected based on a range of wavelengths of the at least one broadband signal transmitted through the respective signal via to adjust a constructive signal interference caused by signal reflections between any two of the additional pads.

2. The printed circuit board of claim 1, wherein each respective additional pad is formed in a respective conductive layer of the plurality of stacked layers of the printed circuit board.

3. The printed circuit board of claim 1, wherein the constructive signal interference increases signal magnitude of selected portions of the at least one broadband signal to reduce the insertion loss deviation of the at least one broadband signal.

4. The printed circuit board of claim 3, wherein magnitude of the constructive signal interference of the at least one broadband signal is adjustable by modifying a respective position of a respective additional pad based on the range of wavelengths of the at least one broadband signal.

5. The printed circuit board of claim 1, wherein each respective additional pad of at least one signal via is separated from at least one stacked layer of the printed circuit board by a via anti-pad.

6. The printed circuit board of claim 1, wherein the plurality of signal pads comprises a plurality of differential signal pad pairs, wherein each differential signal pad pair in the plurality of differential signal pad pairs comprises:
    a positive signal pad; and
    a negative signal pad.

7. The printed circuit board of claim 6, wherein the plurality of signal vias comprises a plurality of signal via pairs, each signal via pair including a positive signal via and a negative signal via, wherein each via from among the positive signal via and the negative signal via includes a corresponding additional pad, each of the corresponding additional pad of each via from among the positive signal via and the negative signal via being separated from at least one stacked layer of the printed circuit board by a plurality of via anti-pads.

8. The printed circuit board of claim 7, wherein:
    the positive signal pad of at least one of the plurality of differential signal pad pairs is electrically coupled to the positive signal via of at least one of the plurality of signal via pairs; and
    the negative signal pad of at least one of the plurality of differential signal pad pairs is electrically coupled to the negative signal via of at least one of the plurality of signal via pairs.

9. The printed circuit board of claim 1, wherein the signal pad layer is a surface layer of the printed circuit board.

10. The printed circuit board of claim 1, wherein a respective one of the plurality of signal pads is disposed on a respective internal layer, parallel to the major plane, of the printed circuit board.

11. A method for fabricating a printed circuit board, the method comprising:
    stacking a plurality of printed circuit board layers, each printed circuit board layer having a respective major plane parallel to a major plane of the printed circuit board;
    forming a plurality of signal pads disposed on a signal pad layer of the printed circuit board that is parallel to the major plane of the printed circuit board;
    electrically coupling a plurality of signal vias to each of the plurality of signal pads, each respective signal via in the plurality of signal vias having a longitudinal axis perpendicular to the major plane of the printed circuit board, each signal via extending through the plurality of printed circuit board layers along the longitudinal axis, each respective signal via being electrically coupled to a respective signal pad of the plurality of signal pads; and
    providing an added capacitive structure in at least one signal via in the plurality of signal vias, which, along with inductance of the at least one signal via, forms a corrective filter to reduce insertion loss deviation of at least one broadband signal in the at least one signal via;
    wherein the added capacitive structure comprises a plurality of additional pads, each additional pad extending from the respective signal via parallel to the major plane of the printed circuit board without coupling conductively to any other portion of the printed circuit board;
    wherein a capacitance of a respective capacitive element formed by each additional pad is tuned by modifying size, shape, and spacing of that additional pad relative other metallic elements of the printed circuit board; and
    wherein positions of the additional pads disposed along the respective signal via are selected based on a range of wavelengths of the at least one broadband signal transmitted through the respective signal via to adjust a constructive signal interference caused by signal reflections between any two of the additional pads.

12. The method for fabricating a printed circuit board according to claim 11, further comprising forming each respective additional pad in a respective conductive layer of the plurality of printed circuit board layers of the printed circuit board.

13. The method for fabricating a printed circuit board according to claim 11, wherein the constructive signal interference that-increases signal magnitude of selected portions of the at least one broadband signal to reduce the insertion loss deviation of the at least one broadband signal.

14. The method for fabricating a printed circuit board according to claim 13, further comprising adjusting the constructive signal interference of the at least one broadband signal by modifying a respective position of a respective additional pad based on the range of wavelengths of the at least one broadband signal.

15. The method for fabricating a printed circuit board according to claim 14, wherein modifying a respective position of the respective additional pad to adjust the constructive signal interference caused by the signal reflections comprises:
    determining whether an insertion loss deviation target has been achieved by including the respective additional pad in a respective printed circuit board layer and, when the insertion loss deviation target has not been achieved, moving the respective additional pad into a respective adjacent printed circuit board layer of the signal via; and
    repeating the determining and the moving until the insertion loss deviation target has been achieved.

16. The method for fabricating a printed circuit board according to claim 11, wherein forming a plurality of signal pads comprises forming a plurality of differential signal pad pairs, wherein each differential signal pad pair in the plurality of differential signal pad pairs comprises:
    a positive signal pad; and
    a negative signal pad.

17. The method for fabricating a printed circuit board according to claim 16, wherein electrically coupling a plurality of signal vias comprises electrically coupling a plurality of signal via pairs, each signal via pair including a positive signal via and a negative signal via, wherein each via from among the positive signal via and the negative signal via includes a corresponding capacitive structure to form a corresponding corrective filter, the corresponding capacitive structure including at least one additional pad, each of the additional pads of the corresponding capacitive structure for each via from among the positive signal via and the negative signal via being separated from at least one printed circuit board layer of the printed circuit board by a plurality of via anti-pads.

18. The method for fabricating a printed circuit board according to claim 17, further comprising:
    electrically coupling the positive signal pad of at least one of the plurality of differential signal pad pairs to the positive signal via of at least one of the plurality of signal via pairs; and
    electrically coupling the negative signal pad of at least one of the plurality of differential signal pad pairs to the negative signal via of at least one of the plurality of signal via pairs.

19. The method for fabricating a printed circuit board according to claim 11, wherein forming a plurality of signals pads disposed on a signal pad layer of the printed circuit board comprises forming a plurality of signal pads disposed on a surface layer of the printed circuit board that is parallel to the major plane of the printed circuit board.

20. The method for fabricating a printed circuit board according to claim 11, wherein forming a plurality of signals pads disposed on a signal pad layer of the printed circuit board comprises forming at least one signal pad out of the plurality of signal pads on an internal layer, parallel to the major plane, of the printed circuit board.

* * * * *